(12) United States Patent
Xie et al.

(10) Patent No.: US 12,352,901 B2
(45) Date of Patent: Jul. 8, 2025

(54) OPTICAL DEVICE TESTING SYSTEM (71) Applicant: Lumentum Operations LLC, San Jose, CA (US)

(72) Inventors: Suning Xie, San Jose, CA (US); Abhinav Rohit, Fremont, CA (US); Lucas Morales, San Francisco, CA (US); Mikhail Dolganov, Gilroy, CA (US); Peter Tran, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 1020 days.

(21) Appl. No.: 17/303,421

(22) Filed: May 28, 2021

(65) Prior Publication Data

US 2022/0291341 A1 Sep. 15, 2022

Related U.S. Application Data (60) Provisional application No. 63/159,206, filed on Mar. 10, 2021.

(51) Int. Cl.
| | | |
|---|---|---|
| *H01S 5/042* | (2006.01) | |
| *G01S 7/484* | (2006.01) | |
| *G01S 7/486* | (2020.01) | |
| *G01S 17/894* | (2020.01) | |
| *H01S 5/00* | (2006.01) | |
| *H01S 5/183* | (2006.01) | |

(52) U.S. Cl.
CPC .............. *G01S 7/484* (2013.01); *G01S 7/486* (2013.01); *G01S 17/894* (2020.01); *H01S 5/0428* (2013.01); *H01S 5/183* (2013.01); *H01S 5/0014* (2013.01)

(58) Field of Classification Search
CPC ..... H01S 5/0014; H01S 5/0021; H01S 5/0428
See application file for complete search history.

(56) References Cited

U.S. PATENT DOCUMENTS

| | | | |
|---|---|---|---|
| 4,724,835 A | * | 2/1988 Liss | ...................... H01S 5/0014 372/38.03 |
| 10,197,669 B2 | | 2/2019 Hall et al. | |

(Continued)

FOREIGN PATENT DOCUMENTS

| | | |
|---|---|---|
| CN | 109073376 A | 12/2018 |
| CN | 110537124 A | 12/2019 |

(Continued)

*Primary Examiner* — Michael Carter
(74) *Attorney, Agent, or Firm* — Harrity & Harrity, LLP (57) ABSTRACT

A characterization circuit for an optical device includes: an optical device, a switch, a switch driver, one or more resistors, and one or more capacitors. The switch driver is configured to receive a trigger pulse from an external pulse generator and to provide the trigger pulse to the switch, which causes the switch to be in an on state. The one or more capacitors are configured to, when the switch is in an off state, receive a charge current (e.g., with a greater than 50 nanoseconds rise time) from an external driver voltage source via the one or more resistors; and, when the switch is in the on state, discharge a current pulse (e.g., with a less than 10 nanosecond pulse width) to the optical device. The optical device is configured to receive the current pulse and to emit, based on the current pulse, an optical output pulse.

20 Claims, 5 Drawing Sheets (56) References Cited

U.S. PATENT DOCUMENTS

| | | | |
|---|---|---|---|
| 10,317,529 | B2 | 6/2019 | Shu et al. |
| 10,545,222 | B2 | 1/2020 | Hall et al. |
| 2018/0306926 | A1 | 10/2018 | LaChapelle et al. |
| 2020/0025928 | A1 | 1/2020 | Gaalema |

FOREIGN PATENT DOCUMENTS

| | | |
|---|---|---|
| CN | 110809704 A | 2/2020 |
| CN | 111337147 A | 6/2020 |

* cited by examiner

OPTICAL DEVICE TESTING SYSTEM

RELATED APPLICATION

This application claims priority to U.S. Provisional Patent Application No. 63/159,206, entitled "SYSTEMS AND METHODS FOR HIGH-SPEED AND HIGH-CURRENT CHARACTERIZATION AND RELIABILITY TESTING OF VCSEL ARRAYS," filed on Mar. 10, 2021, the content of which is incorporated by reference herein in its entirety.

TECHNICAL FIELD

The present disclosure relates generally to an optical device testing system and to facilitate testing of an optical device using high-current pulses in a nanosecond range.

BACKGROUND

An optical device may include an array of emitters. In some applications, such as in automotive and/or light detection and ranging (LIDAR) applications, the optical device may need to produce optical output pulses with a high peak optical power.

SUMMARY

In some implementations, a characterization circuit for an optical device includes the optical device; a switch; a switch driver; one or more resistors; and one or more capacitors, wherein: the switch driver is configured to receive, via a first card edge connector trace, a trigger pulse from an external pulse generator and to provide the trigger pulse to the switch, wherein a pulse width of the trigger pulse is greater than or equal to a first threshold; the switch is configured to receive the trigger pulse from the external pulse generator and to be in an on state when receiving the trigger pulse; the switch is configured to be in an off state when not receiving the trigger pulse; the one or more capacitors are configured to, when the switch is in the off state, receive, via a second card edge connector trace, a charge current from an external driver voltage source via the one or more resistors wherein a rise time of the charge current is greater than a second threshold; the one or more capacitors are configured to, when the switch is in the on state, discharge a current pulse to the optical device, wherein a pulse width of the current pulse is less than a third threshold, wherein an average current associated with a flow of the charge current through the one or more resistors from the external driver voltage source to the one or more capacitors matches an average current associated with the flow of the current pulse through the optical device; and the optical device is configured to receive the current pulse from the one or more capacitors and to emit, based on a flow of the current pulse through the optical device, an optical output pulse.

In some implementations, an optical device testing system includes a printed circuit board (PCB) that comprises an electrical driver circuit that includes an optical device; a card edge connector; a direct current (DC) power supply; a driver voltage source; a pulse generator; and one or more testing components, wherein: the card edge connector is electrically connected to the PCB via one or more card edge connector traces of the PCB; the DC power supply is configured to provide power to the electrical driver circuit of the PCB; the driver voltage source is configured to provide a charge current to one or more capacitors of the electrical driver circuit; the pulse generator is configured to provide a trigger pulse to a field-effect transistor (FET) switch of the electrical driver circuit, wherein a pulse width of the trigger pulse is greater than or equal to 10 nanoseconds, wherein providing the trigger pulse to the FET switch causes the one or more capacitors of the electrical driver circuit to discharge a current pulse to the optical device, which causes the optical device to emit an optical output pulse, and wherein a pulse width of the current pulse is less than 10 nanoseconds; and the optical device testing system is configured to perform characterization testing of the optical device.

In some implementations, an optical device testing system includes an optical pulse generator that comprises an electrical driver circuit that includes an optical device; a direct current (DC) power supply; a driver voltage source; a pulse generator; a card edge connector; a motherboard; and an environmental chamber, wherein: the card edge connector is electrically connected to the optical pulse generator via one or more card edge connector traces of the optical pulse generator, the card edge connector is electrically connected to the motherboard, the DC power supply is electrically connected to the motherboard and is configured to provide power to the electrical driver circuit of the optical pulse generator via the motherboard, the card edge connector, and a first card edge connector trace of the one or more card edge connector traces, the driver voltage source is electrically connected to the motherboard and is configured to provide a charge current to one or more capacitors of the electrical driver circuit via the motherboard, the card edge connector, and a second card edge connector trace of the one or more card edge connector traces, wherein a rise time of the charge current is greater than 50 nanoseconds, the pulse generator is electrically connected to the motherboard and is configured to provide a trigger pulse to a switch of the electrical driver circuit via the motherboard, the card edge connector, and a third card edge connector trace of the one or more card edge connector traces, wherein a pulse width of the trigger pulse is greater than or equal to 10 nanoseconds, wherein providing the trigger pulse to the switch causes the one or more capacitors of the electrical driver circuit to discharge a current pulse to the optical device, which causes the optical device to emit an optical output pulse, and wherein a pulse width of the current pulse is less than 10 nanoseconds, the environmental chamber is configured to hold the motherboard, the card edge connector, and the optical pulse generator with the optical device within an internal portion of the environmental chamber, and the optical device testing system is configured to perform reliability stress testing of the optical device.

DETAILED DESCRIPTION

The following detailed description of example implementations refers to the accompanying drawings. The same reference numbers in different drawings may identify the same or similar elements.

An optical device may include an array of emitters, such as a vertical cavity surface emitting laser (VCSEL) array. In some applications, such as in automotive and/or light detection and ranging (LIDAR) applications, the optical device may include hundreds of emitters that need to produce optical output pulses with a high peak optical power. Accordingly, to perform characterization and reliability testing of the optical device, electric pulses used to generate optical output pulses need to be generated at high speed (e.g., pulses with a short duration, such as less than 10 nanoseconds) and high current (e.g., pulses with a high peak current, such as greater than approximately 200 amps). This is a challenge for conventional platforms and/or methodologies that are used to test VCSEL arrays associated with data communication (datacom) applications or mobile device applications. For example, a VCSEL array associated with a datacom application typically includes a single emitter that requires an electric pulse with a current less than 10 milliamps to test the emitter. As another example, a VCSEL array associated with a mobile device application for three dimensional (3D) sensing typically includes tens to hundreds of emitters that require an electric pulse with a duration of a few milliseconds. Moreover, high speed and high current testing of an optical device for LIDAR applications is often limited by a parasitic inductance associated with a conventional testing platform (e.g., in a circuit associated with the testing platform that is configured to provide electric pulses to the optical device to test the optical device).

Further, some conventional high-speed and/or high-current systems use radio frequency (RF) techniques, such as subMiniature version A (SMA) connectors and coaxial cables for inputs and/or outputs, and/or transmission line probe principles that are built-in at test points on printed circuit boards (PCBs) for impedance matching and waveform fidelity. Typically, current sensing is done by measuring a voltage waveform of a shunt resistor. While these techniques can be used in PCBs for VCSEL array characterization, such techniques are impractical physically and cost-wise for reliability testing where a large quantity (e.g., hundreds) of samples need to be stress tested at the same time. While a goal is to test or evaluate VCSEL array chips' performance and reliability, the complexity of such conventional test platforms and/or systems poses its own reliability risks. Further, shunt resistors for current sensing are also undesirable because they add parasitic inductance to a resonance circuit. Additionally, shunt resistors may not provide accurate measurements of peak currents. A shunt resistance of 0.1 Ohm for high current is comparable to a series resistance of a high power VCSEL array, which affects driver performance.

Some implementations described herein provide a printed circuit board (PCB) that includes an electrical driver circuit. The electrical driver circuit may include an optical device, a field-effect transistor (FET) switch, a FET driver, one or more resistors, one or more inductors, and/or one or more capacitors. The FET driver may be configured to receive a trigger pulse from an external pulse generator and to provide the trigger pulse to the FET switch. The FET switch may be configured to receive the trigger pulse from the external pulse generator and to be in an on state when receiving the trigger pulse. Accordingly, the FET switch may be configured to be in an off state when not receiving the trigger pulse. The one or more capacitors may be configured to, when the FET switch is in the off state, receive a charge current from an external driver voltage source via the one or more resistors, and, when the FET switch is in the on state, discharge a current pulse to the optical device. The pulse width of the current pulse may be less than 10 nanoseconds and/or a peak current of the current pulse may be greater than or equal to 200 amps. The optical device may be configured to receive the current pulse from the one or more capacitors and to emit, based on a flow of the current pulse through the optical device, an optical output pulse. In this way, some implementations generate high speed and high current pulses that may be used to test the optical device.

Further, in some implementations, the PCB may be included in an optical device testing system. For example, the PCB may comprise one or more card edge connector traces that are configured to electrically connect the PCB with a card edge connector of the optical device testing system. In some implementations, the optical device testing system may include the driver voltage source and the pulse generator, which may respectively provide the charge current and the trigger pulse to the electrical driver circuit, as described above.

In some implementations, the optical device testing system may include one or more testing components to (e.g., a power meter, an oscilloscope, and/or a multi-meter, among other examples) and one or more processors to facilitate characterization testing of the optical device. Due to a configuration of the electrical driver circuit, the current pulse that flows through the optical device may have an average current that matches an average current of the charge current that flows through the one or more resistors and a normalized waveform (e.g., a normalized current waveform and/or a normalized voltage waveform) of the current pulse may be approximately the same as a normalized optical waveform of the optical output pulse. Accordingly, the one or more processors may obtain information from the one or more testing components related to the charge current and the optical output pulse to determine one or more electrical properties of the current pulse (e.g., a peak current of the current pulse and/or a peak voltage of the current pulse). In this way, some implementations allow characterization of a high speed, high current pulse of an optical device to be measured based on a low speed, low current charge current and/or optical properties of an optical output pulse of the optical device.

In some implementations, the optical device testing system may include a rack that holds multiple motherboards, where each motherboard may include multiple edge connectors, and where each card edge connecter may hold a PCB. In this way, multiple optical devices associated with the PCBs may be tested at the same time. Further, the optical device testing system may include an environmental chamber in which the rack may be placed to perform reliability stress testing of the multiple optical devices (e.g., in different environmental conditions).

Accordingly, by using card edge connectors and/or wires, instead of conventional SMA connectors and/or coaxial cables and transmission line probe circuits, some implementations described herein facilitate testing of high-speed operation and characterization of a VCSEL array on a PCB. This is because an inductance, a capacitance, and/or a resistance (e.g., that is parasitic or that is by design), outside a parallel LC circuit on the PCB, have a minimal impact on a resonance of the LC circuit on the PCB.

Moreover, some implementations described herein provide a method for peak current determination of the current pulse. The method may convert a measurement of average current of a low-bandwidth and/or low-peak charge current at a power supply associated with the PCB into determination of the peak parameters (i.e. current and/or waveform) of a high-speed and/or a high-current current pulse. This enables use of a card edge connector (e.g., that is usually used for DC or low-bandwidth signals). In some implementations, peak power, peak current and peak voltage (across a VCSEL diode) can be determined from a measured average power, average current, and/or voltage and optical waveforms.

In RF measurements, peak values (e.g., power, current, or voltage) of high-speed signals with square waveforms are often determined by a measured average value divided by a duty cycle. In contrast, waveforms from an ideal discharge driver have a sine waveform. Moreover, actual waveforms may deviate from a sine waveform due to a damping factor (e.g., that depends on series resistance in a resonance circuit). Peak values can be determined based on measured average values with arbitrary waveforms using processes described below.

Figure 1A:
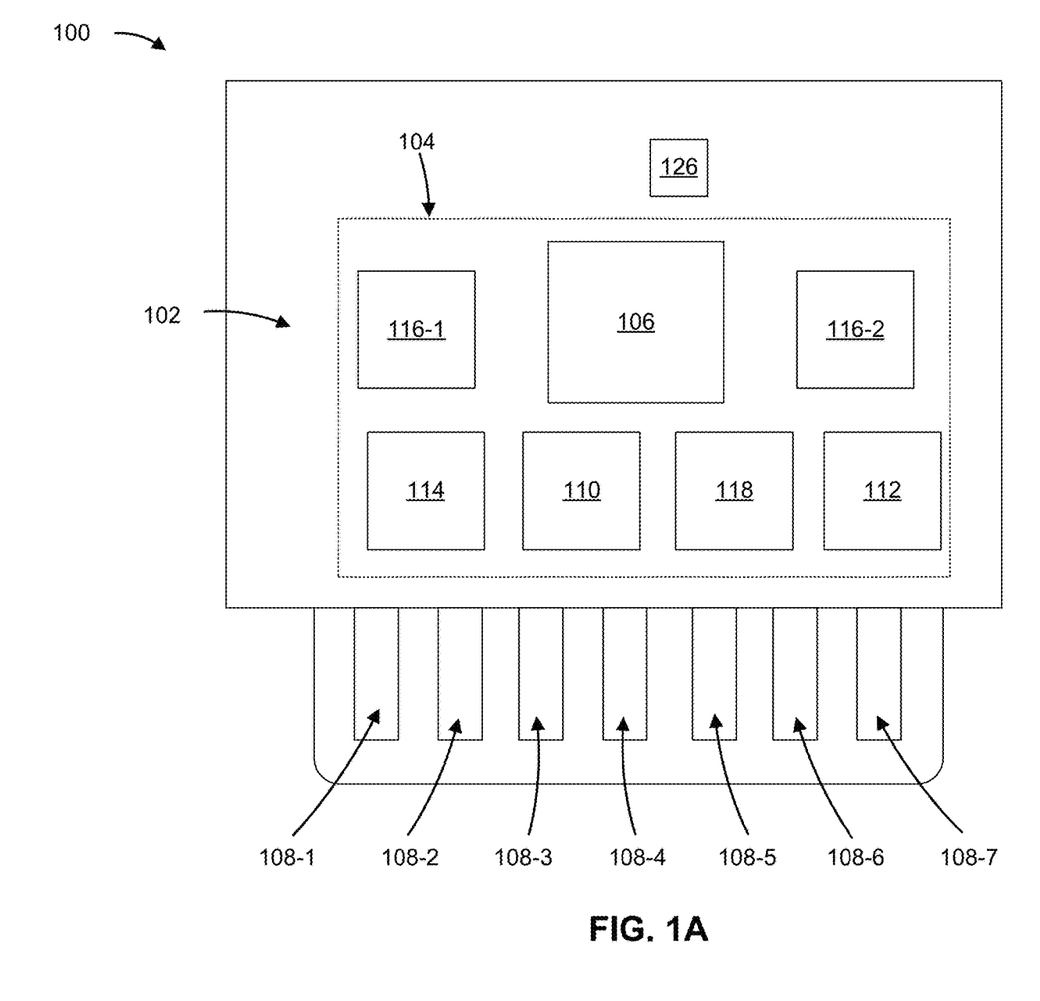
FIGS. 1A-1B are diagrams of an example implementation described herein.
Figure 1B:
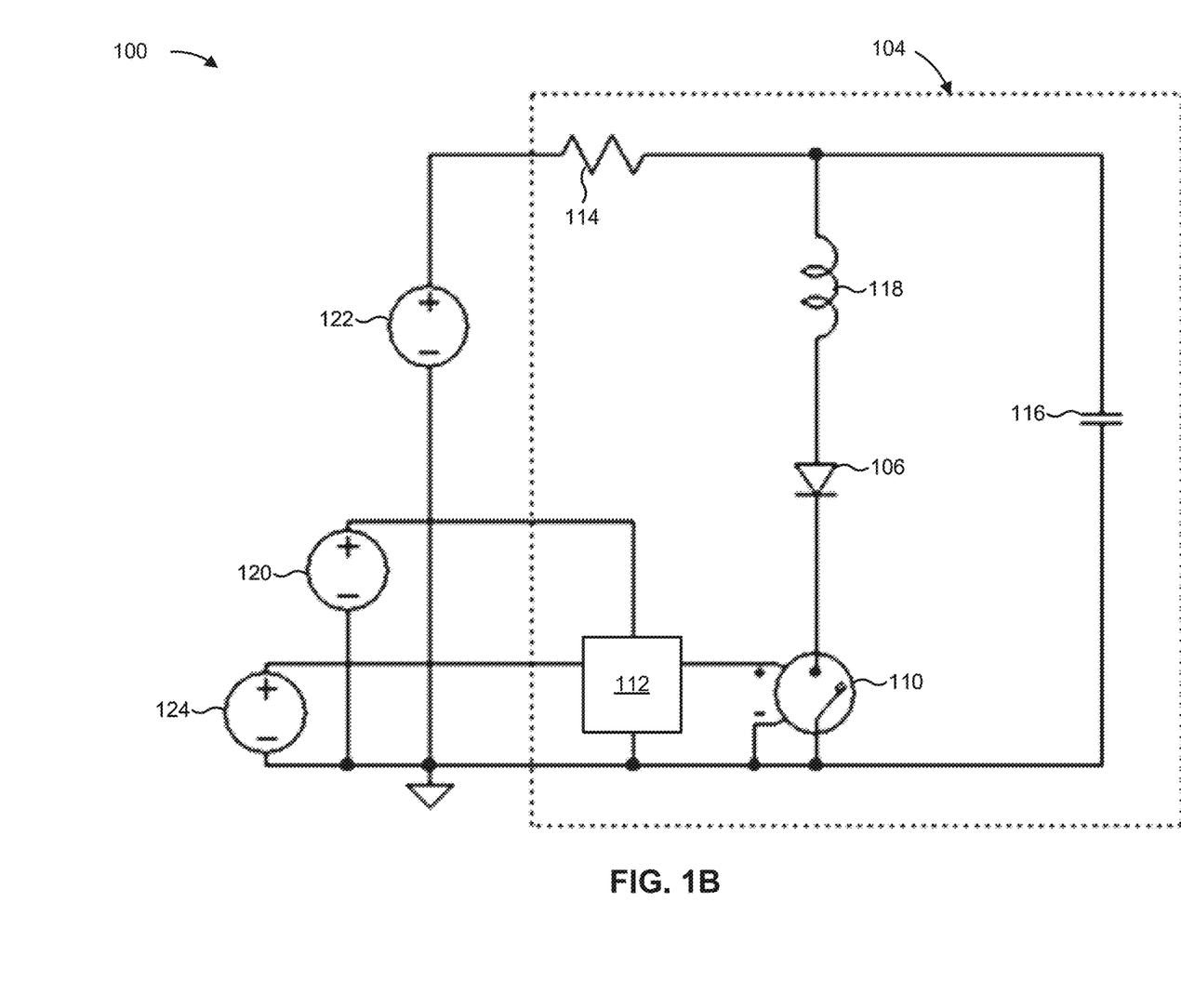

FIGS. 1A-1B are diagrams of an example implementation 100 associated with an optical device testing system described herein (e.g., the optical device testing system 200 described herein in relation to FIG. 2 and/or the optical device testing system 300 described herein in relation to FIG. 3). As shown in FIGS. 1A-1B, a printed circuit board (PCB) 102 may include an electrical driver circuit 104 (e.g., that includes an optical device 106 to be tested), and/or one or more traces 108 (e.g., shown as traces 108-1 through 108-7 in FIG. 1A). The optical device 106 may include an array of emitters. For example, the optical device 106 may include a light emitting diode (LED) array, a vertical cavity surface emitting laser (VCSEL) array, and/or an edge emitting laser (EEL) array. The array of emitters may include multiple emitters, such as up to hundreds of emitters. In some implementations, the optical device 106 may have a series resistance when included in a circuit, such as the electrical driver circuit 104.

The electrical driver circuit 104 may comprise a resonant capacitor discharge driver circuit and may include, for example, the optical device 106, a switch 110 (e.g., a field-effect transistor (FET) switch), a switch driver 112 (e.g., a FET driver), one or more resistors 114, one or more capacitors 116 (shown as capacitors 116-1 and 116-2 in FIG. 1A), and/or one or more inductors 118. The switch 110 may comprise, for example, an enhanced gallium nitride FET (eGaN FET) switch or a metal-oxide-semiconductor FET (MOSFET) switch. The switch driver 112 may comprise, for example, an eGaN FET driver or a MOSFET driver. In some implementations, the electrical driver circuit 104 may comprise a plurality of resistors 114 (e.g., arranged in parallel), as opposed to just one resistor 114, to minimize an amount of inductance associated with the one or more resistors 114. Additionally, or alternatively, the electrical driver circuit 104 may comprise a plurality of capacitors 116 (e.g., arranged in parallel), as opposed to just one capacitor 116, to minimize an amount of inductance associated with the one or more capacitors 116. In some implementations, the inductor 118 may be a physical component of the electrical driver circuit 104 or may be a parasitic inductance of the electrical driver circuit 104. As shown in FIG. 1B, the optical device 106 (e.g., that has a series resistance), the inductor 118, and the one or more capacitors 116 may form a resistor-inductor-capacitor (RLC) resonance circuit.

As further shown in FIG. 1B, a direct current (DC) power supply 120, such as a 5 volt (V) power supply, may be electrically connected to the electrical driver circuit 104. The DC power supply 120 may be an external power supply (e.g., the DC power supply 120 may not be included in or on the PCB 102) and may be electrically connected to the electrical driver circuit 104 via the one or more traces 108 (e.g., via the trace 108-1 as described herein). The DC power supply 120 may be configured to provide power (e.g., a DC power supply) to the electrical driver circuit 104 (e.g., to allow the electrical driver circuit 104 to charge the one or more capacitors 116 and/or to test the optical device 106, as described herein).

A driver voltage source 122 may be electrically connected to the electrical driver circuit 104. The driver voltage source 122 may be an external voltage source (e.g., the driver voltage source 122 may not be included in or on the PCB 102) and may be electrically connected to the electrical driver circuit 104 via the one or more traces 108 (e.g., via the trace 108-2 as described herein). As shown in FIG. 1B, the driver voltage source 122 may be electrically connected to the one or more resistors 114 and the one or more capacitors 116, and the driver voltage source 122 (e.g., when the driver voltage source 122 is in an on state) may be configured to provide a charge current to the one or more capacitors 116 (e.g., via the one or more resistors 114) to charge the one or more capacitors 116 (e.g., when the switch 110 is off, as described herein). The charge current may have a peak current that is less than or equal to 1 amp (A). The charge current may have a rise time that is greater than 50 ns. The driver voltage source 122 may provide the charge current to the one or more capacitors 116 for a charge time (e.g., that is within a period of a trigger pulse, described herein). The charge time may be an amount of time needed to fully charge the one or more capacitors 116.

A pulse generator 124 may be electrically connected to the electrical driver circuit 104. The pulse generator 124 may be an external pulse generator (e.g., the pulse generator 124 may not be included in or on the PCB 102) and may be electrically connected to the electrical driver circuit 104 via the one or more traces 108 (e.g., via the trace 108-3 as described herein). As shown in FIG. 1B, the pulse generator 124 may be electrically connected to the switch driver 112 and may be configured to provide a trigger pulse to the switch 110 via the switch driver 112 (e.g., to control whether the switch 110 is in an on state or an off state). A pulse width of the trigger pulse may be greater than or equal to 10 ns.

For example, when the pulse generator 124 is in an off state, the pulse generator may refrain from providing a trigger pulse to the switch 110. Accordingly, this may cause the switch 110 to be in an off state and may cause the driver voltage source 122 to provide the charge current to the one or more capacitors 116 (e.g., as described above). As another example, when the pulse generator 124 is in an on state, the pulse generator may generate and provide, via the switch driver 112, a trigger pulse to the switch 110. Accordingly, this may cause the switch 110 to be in an on state and may cause the one or more capacitors 116 to discharge a current pulse to the optical device 106 via the inductor 118 (e.g., cause the RLC resonance circuit to generate and provide the current pulse to the optical device 106). A pulse width of the current pulse may be less than 10 ns. In this way, a high-speed current pulse (e.g., with a pulse width less than 10 ns) may be generated using a low-speed trigger pulse (e.g., with a pulse width greater than 10 ns) to test the optical device 106 (e.g., to cause the optical device to emit an optical output pulse, as further described herein in relation to FIG. 2).

In some implementations, a current waveform of the current pulse may be non-square (e.g., due to a small pulse width of the current pulse). For example, the current waveform may be sinusoidal (e.g., as determined by a resonance of the RLC circuit).

In some implementations, the current pulse may have a peak current that is greater than the peak current of the charge current (e.g., the peak current of the current pulse may be greater than 1 A). In some implementations, the peak current of the current pulse may be over 100 times greater than the peak current of the charge current. For example, the peak current of the current pulse may be greater than or equal to 200 A when the peak current of the charge current is less than 1 A. Additionally, or alternatively, an average current of the charge current (e.g., when the charge current flows through the one or more resistors 114 from the driver voltage source 122 to the one or more capacitors 116, such as when the switch 110 is in an off state), may match (e.g., may be equal to, or approximately equal to) an average current of the current pulse (e.g., when the current pulse flows through the optical device 106, such as when the switch 110 is in an on state).

As further shown in FIG. 1A, the PCB 102 may include a thermistor 126. The thermistor 126 may be electrically connected to a multi-meter (e.g., multi-meter 204 described herein in relation to FIG. 2), or another device, via the one or more traces 108 (e.g., via the trace 108-4 as described herein). The thermistor 126 may be configured to monitor a temperature of the PCB 102 (e.g., during testing of the optical device 106). For example, the thermistor 126 of the electrical driver circuit 104 may provide, via the trace 108-4, an electrical signal associated with the PCB 102 (e.g., where a resistance of the electrical signal indicates a temperature of the PCB 102). Alternatively, a thermocouple or other device may be used to monitor the temperature.

In some implementations, the one or more traces 108 may be configured to allow the PCB 102 to electrically connect with one or more devices. For example, as shown in FIG. 1A, the trace 108-1 may electrically connect the electrical driver circuit 104 to the DC power supply 120 (e.g., as described above), the trace 108-2 may electrically connect the electrical driver circuit 104 to the driver voltage source 122 (e.g., as described above), and/or the trace 108-3 may electrically connect the electrical driver circuit 104 to the pulse generator 124 (e.g., as described above). As another example, the trace 108-4 may electrically connect the thermistor 126 to the multi-meter (e.g., as described above). In an additional example, the trace 108-5 may electrically connect an anode of the optical device 106 to an oscilloscope and/or the trace 108-6 may electrically connect a cathode of the optical device 106 to oscilloscope to allow the oscilloscope to monitor the anode and the cathode associated with the optical device 106. In another example, the trace 108-7 may connect the electrical driver circuit 104 to a ground (e.g., ground 206 described herein in relation to FIG. 2).

Figure 2:
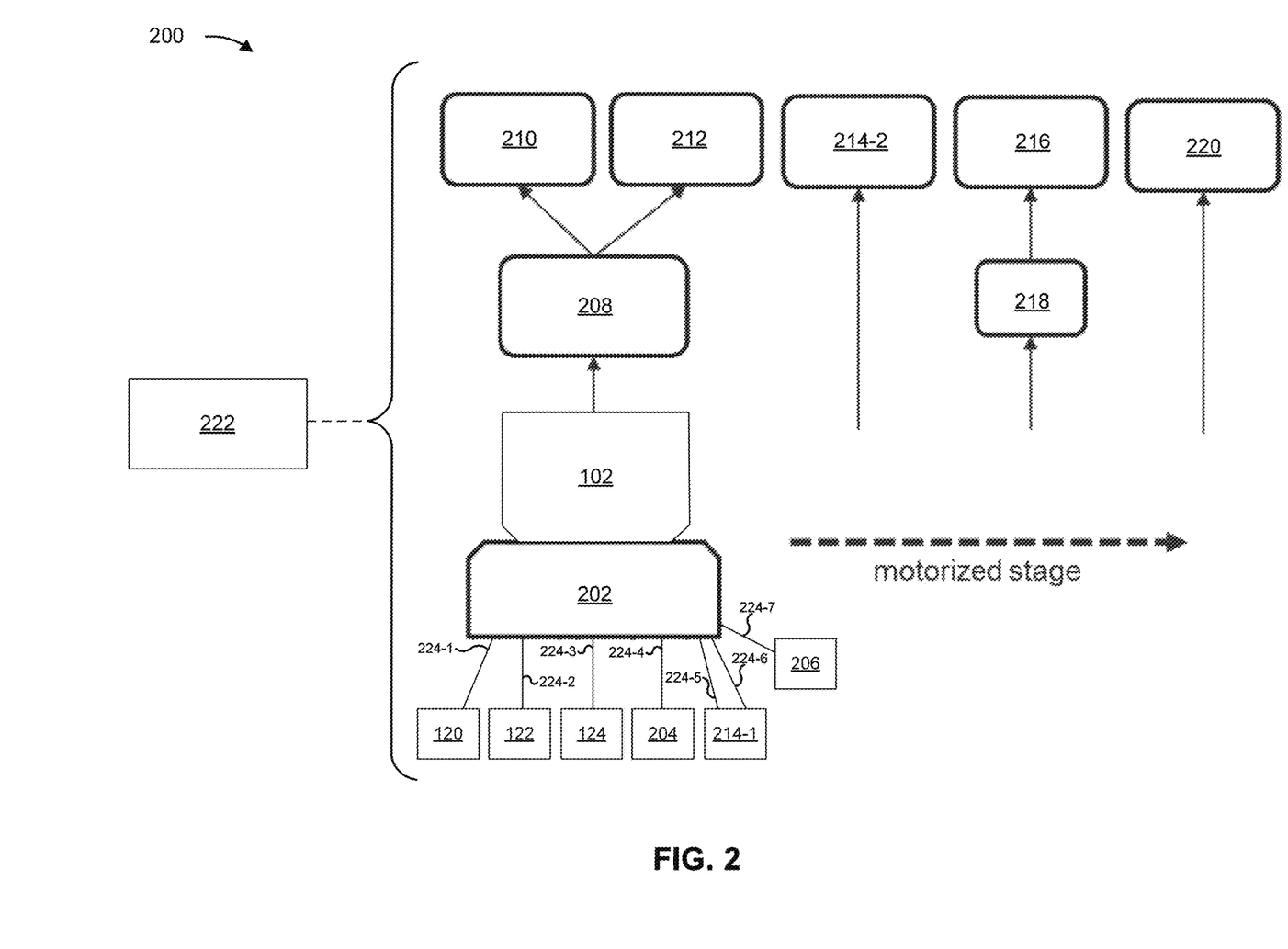
FIG. 2 is a diagram of an example optical device testing system described herein.
Figure 3:
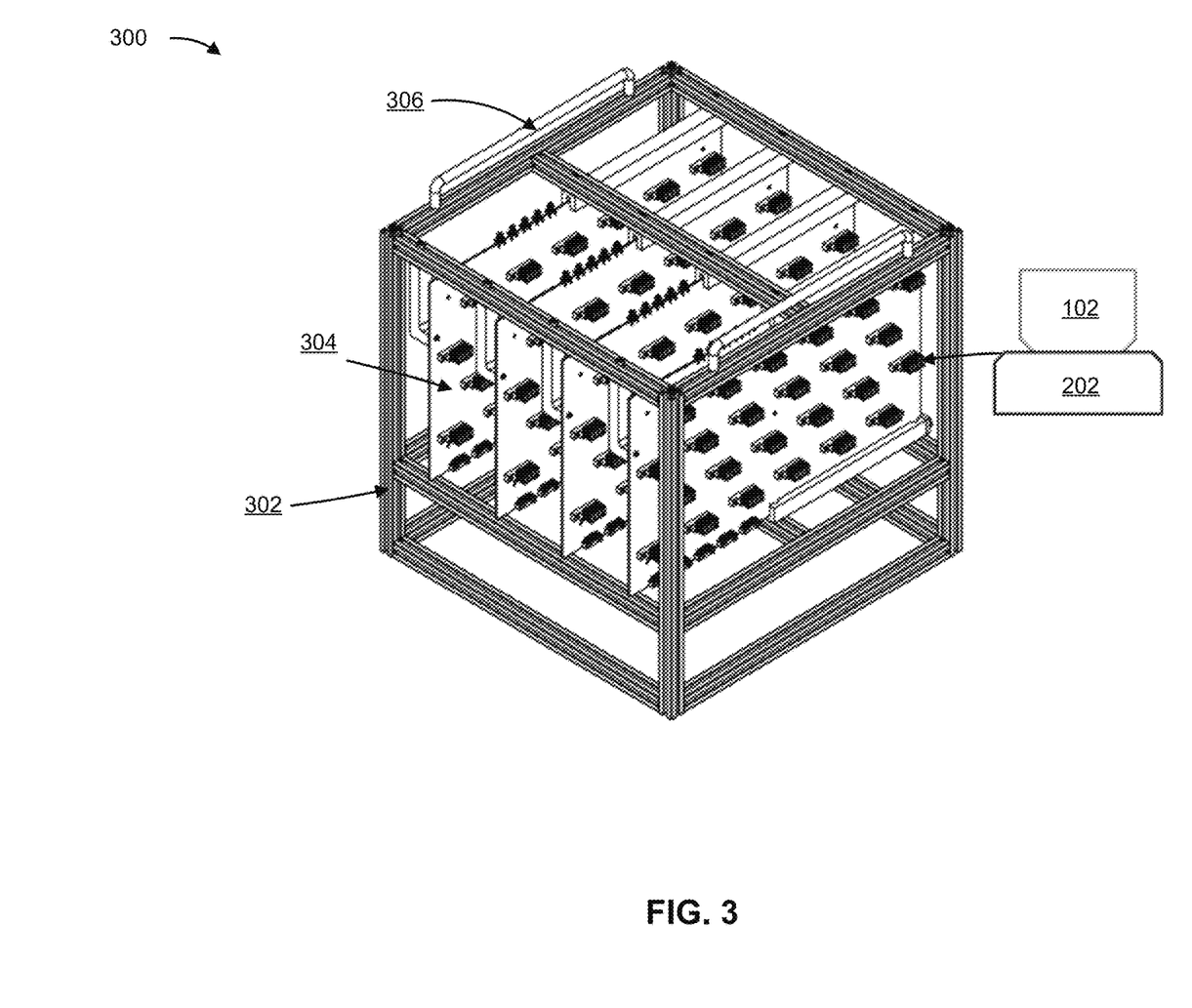
FIG. 3 is a diagram of another example optical device testing system described herein.

In some implementations, the one or more traces 108 may be edge connector traces and may be configured to electrically connect with a card edge connector (e.g., card edge connector 202 described herein in relation to FIGS. 2-3) of an optical device testing system (e.g., optical device testing system 200 described herein in relation to FIG. 2 or optical device testing system 300 described herein in relation to FIG. 3). Accordingly, in some implementations, the card edge connector may electrically connect the one or more traces 108 to the one or more devices (e.g., the DC power supply 120, the driver voltage source 122, the pulse generator 124, the multi-meter, and/or the ground among other examples).

As indicated above, FIGS. 1A-1B are provided as an example. Other examples may differ from what is described with regard to FIGS. 1A-1B.

FIG. 2 is a diagram of an example optical device testing system 200 described herein. As shown in FIG. 2, the optical device testing system 200 may include the PCB 102, a card edge connector 202, the DC power supply 120, the driver voltage source 122, and the pulse generator 124. Additionally, or alternatively, the optical device testing system 200 may include a multi-meter 204, a ground 206, an integrating sphere 208, a power meter 210, a spectrometer 212, one or more oscilloscopes 214 (shown as first oscilloscope 214-1 and second oscilloscope 214-2), a near field camera 216 (e.g., that is associated with a lens 218), a far field camera 220, and/or one or more processors 222, among other examples. In some implementations, the optical device testing system 200 may be an optical device performance characterization system (e.g., the optical device testing system 200 may be configured to perform characterization testing of the of the optical device 106 included on the PCB 102, as described herein).

The card edge connector 202 may be configured to physically hold the PCB 102 (e.g., to allow the optical device 106, that is included on the PCB 102, to be tested by the optical device testing system 200). For example, the card edge connector 202 may include a recess (or other physical structure) in which the PCB 102 may be inserted and held by the card edge connector 202. Additionally, or alternatively, the card edge connector 202 may be configured to electrically connect to the PCB 102. For example, the card edge connector 202 may include one or more traces (not shown in FIG. 2) that electrically connect to the one or more traces 108 of the PCB 102 (e.g., when the PCB 102 is inserted in the recess of the card edge connector 202). In some implementations, the card edge connector 202 may include a heatsink and/or a thermoelectric cooler (TEC) to transfer heat from the PCB 102 (e.g., when the optical device 106 is tested by the optical device testing system 200). While the card edge connector 202 is described in some implementations as a card edge connector, one or more other electrical connectors (e.g., low-speed electrical connectors) may be used, such as one or more pogo-pin connectors.

As further shown in FIG. 2, the DC power supply 120 may be electrically connected to the card edge connector 202 (e.g., via an electrical contact 224-1). In some implementations, the DC power supply 120 may provide a DC power supply (e.g., a 5 V power supply) to the card edge connector 202, which may provide the DC power supply to the electrical driver circuit 104 of the PCB 102 via the trace 108-1 (e.g., when the PCB 102 is inserted into the card edge connector 202). The DC power supply 120 may be configured to provide the DC power supply to the electrical driver circuit 104 to allow the electrical driver circuit 104 to charge or discharge the one or more capacitors 116 and/or to test the optical device 106 (e.g., as described herein in relation to FIGS. 1A-1B).

As further shown in FIG. 2, the driver voltage source 122 may be electrically connected to the card edge connector 202 (e.g., via an electrical contact 224-2). In some implementations, the driver voltage source 122 may provide a charge current to the card edge connector 202, which may provide the charge current to the electrical driver circuit 104 of the PCB 102 via the trace 108-2 (e.g., when the PCB 102 is inserted into the card edge connector 202). The driver voltage source 122 may be configured to provide the charge current to the one or more capacitors 116 of the electrical driver circuit 104 to charge the one or more capacitors 116 (e.g., as described herein in relation to FIGS. 1A-1B).

As further shown in FIG. 2, the pulse generator 124 may be electrically connected to the card edge connector 202

(e.g., via an electrical contact 224-3). In some implementations, the pulse generator 124 may provide a trigger pulse to the card edge connector 202, which may provide the trigger pulse to the electrical driver circuit 104 of the PCB 102 via the trace 108-3 (e.g., when the PCB 102 is inserted into the card edge connector 202). The pulse generator 124 may be configured to provide a trigger pulse to the switch 110 via the switch driver 112 of the electrical driver circuit 104 (e.g., to control whether the switch 110 is in an on state or an off state). Accordingly, the pulse generator 124 may control when the driver voltage source 122 provides a charge current to the one or more capacitors 116 of the of the electrical driver circuit 104 and/or when the one or more capacitors 116 discharge a current pulse to the optical device 106 included in the electrical driver circuit 104 to test the optical device 106 (e.g., as described herein in relation to FIGS. 1A-1B).

As further shown in FIG. 2, the multi-meter 204 (e.g., a digital multi-meter) may be electrically connected to the card edge connector 202 (e.g., via an electrical contact 224-4). In some implementations, the thermistor 126 of the electrical driver circuit 104 may provide, via the trace 108-4, an electrical signal associated with the PCB 102 (e.g., where a resistance of the electrical signal indicates a temperature of the PCB 102) to the card edge connector 202 (e.g., when the PCB 102 is inserted into the card edge connector 202), which may provide the electrical signal to the multi-meter 204. The multi-meter 204 may be configured to determine a resistance of the electrical signal to facilitate a determination of a temperature of the PCB 102.

As further shown in FIG. 2, a first oscilloscope 214-1 may be electrically connected to the card edge connector 202 (e.g., via an electrical contact 224-5 and an electrical contact 224-6). In some implementations, an anode of the optical device 106 may be electrically connected, via the trace 108-5 and the card edge connector 202, to the first oscilloscope 214-1 and/or a cathode of the optical device 106 may be electrically connected, via the trace 108-6 and the card edge connector 202, to the first oscilloscope 214-1. Accordingly, based on these connections, the first oscilloscope 214-1 may be configured to determine one or more voltage properties of the current pulse (e.g., when the current pulse flows through the optical device 106).

As further shown in FIG. 2, the ground 206 may be electrically connected to the card edge connector 202 (e.g., via an electrical contact 224-7). The ground 206 may be configured to provide an electrical ground for the electrical driver circuit 104. For example, the electrical driver circuit 104 may be electrically connected, via the trace 108-7 and the card edge connector 202, to the ground 206.

In some implementations, the power meter 210 may be configured to determine an optical power of an optical output pulse of the optical device 106, and the spectrometer 212 may be configured to determine spectral data associated with the optical output of the optical device 106. For example, as described above, the pulse generator 124 may provide a trigger pulse to cause the switch 110 be in an on state and thereby cause the one or more capacitors 116 to discharge a current pulse to the optical device 106, which may cause the optical device 106 to emit an optical output pulse. The optical output pulse may transmit to the integrating sphere 208, which may include one or more optical sensor elements (e.g., that are configured to determine optical power measurements) that are connected to the power meter 210 and/or connected to (e.g., via multi-mode optical fibers (MMFs)) the spectrometer 212. The power meter 210 may be configured to determine (e.g., based on data provided by the one or more optical sensor elements) an average optical power associated with the optical output pulse of the optical device 106. The spectrometer 212 may be configured to determine (e.g., based on data provided by the one or more optical sensor elements) one or more wavelength spectra associated with the optical output pulses of the optical device 106.

In some implementations, a second oscilloscope 214-2 may be configured to determine an optical waveform associated with the optical output of the optical device 106. For example, as described above, the pulse generator 124 may provide a trigger pulse to cause the switch 110 be in an on state and thereby cause the one or more capacitors 116 to discharge a current pulse to the optical device 106, which may cause the optical device 106 to emit an optical output pulse. The optical output pulse may transmit to the second oscilloscope 214-2 (e.g., via an MMF and a high-speed receiver), which may measure the optical output pulse to determine the optical waveform. In some implementations, the optical waveform may be non-square (e.g., because a waveform of the current pulse is non-square). For example, the optical waveform may be sinusoidal.

In some implementations, the near field camera 216 and the far field camera 220 may be configured to determine spatial characteristics and/or propagation characteristics associated with the optical output pulse of the optical device 106. For example, as described above, the pulse generator 124 may provide a trigger pulse to cause the switch 110 be in an on state and thereby cause the one or more capacitors 116 to discharge a current pulse to the optical device 106, which may cause the optical device 106 to emit an optical output pulse. The optical output pulse may transmit to the near field camera 216, via the lens 218, which may measure the optical output pulse to determine spatial characteristics and/or propagation characteristics associated with the optical output pulse in a near field. The optical output pulse may transmit to the far field camera 220, which may measure the optical output pulse to determine spatial characteristics and/or propagation characteristics associated with the optical output pulse in a far field.

As further shown in FIG. 2, the optical device testing system 200 may include a motorized stage. The PCB 102 (e.g., when the PCB 102 is inserted into the card edge connector 202), the card edge connector 202, the DC power supply 120, the driver voltage source 122, the pulse generator 124, the multi-meter 204, and/or the ground 206 may be disposed on the motorized stage, and the motorized stage may be configured to move (e.g., laterally) to different testing regions, where an individual testing region is associated with one or more of the integrating sphere 208, the power meter 210, the spectrometer 212, the second oscilloscope 214-2, the near field camera 216, and/or the far field camera 220. In this way, the motorized stage may facilitate testing (e.g., sequential testing) of the optical device 106 by at least one of the integrating sphere 208, the power meter 210, the spectrometer 212, the second oscilloscope 214-2, the near field camera 216, and/or the far field camera 220 as described above.

A processor 222, of the one or more processors 222, includes a central processing unit, a graphics processing unit, a microprocessor, a controller, a microcontroller, a digital signal processor, a field-programmable gate array, an application-specific integrated circuit, and/or another type of processing component. The processor 222 is implemented in hardware, firmware, or a combination of hardware and software. The one or more processors 222 may be connected to one or more other components of the optical device testing system 200 via a bus (e.g., a component that enables wired and/or wireless communication among the components of the optical device testing system 200).

In some implementations, the one or more processors 222 may be configured to control the optical device testing system 200. In some implementations, the one or more processors 222 may be electrically connected to and may be configured to control the DC power supply 120, the driver voltage source 122, and/or the pulse generator 124. For example, the one or more processors 222 may cause the DC power supply 120 to provide a DC power supply to the electrical driver circuit 104 to allow the electrical driver circuit 104 to charge or discharge the one or more capacitors 116 and/or to test the optical device 106 of the electrical driver circuit 104 (e.g., as described herein). As another example, the one or more processors 222 may cause the driver voltage source 122 to provide a charge current to the one or more capacitors 116 of the electrical driver circuit 104 to charge the one or more capacitors 116 (e.g., as described herein). In an additional example, the one or more processors 222 may cause the pulse generator 124 to provide a trigger pulse to the switch 110 of the electrical driver circuit 104 (e.g., to cause the switch 110 to be in an on state) and thereby cause the one or more capacitors 116 to discharge a current pulse to the optical device 106 included in the electrical driver circuit 104, and thereby further causes the optical device 106 to emit an optical output pulse (e.g., as described herein).

In some implementations, the one or more processors 222 may be configured to obtain test information from the multi-meter 204, the power meter 210, the spectrometer 212, the one or more oscilloscopes 214, the near field camera 216, and/or the far field camera 220. The test information may include, for example, one or more one or more electrical properties (e.g., a current) of the charge current, one or more electrical properties of one or more optical properties (e.g., an optical power, spectral data, an optical waveform, spatial characteristics, and/or propagation characteristics, among other examples) of the optical output pulse.

In some implementations, the one or more processors 222 may process the test information to determine a peak optical power associated with the optical output pulse of the optical device 106, to determine a peak current associated with a flow of the current pulse through the optical device 106, and/or to determine a peak voltage associated with the flow of the current pulse through the optical device 106.

For example, to determine the peak optical power associated with the optical output pulse of the optical device 106, the one or more processors 222 may process (e.g., parse) the test information to identify an average optical power and an optical waveform (e.g., with a non-square waveform, such as a sinusoidal waveform) associated with the optical output pulse of the optical device 106. The one or more processors 222 may process the optical waveform to determine a normalized optical waveform. For example, the one or more processors 222 may determine a maximum value associated with the optical waveform (e.g., a maximum optical power associated with the optical waveform) and may divide the optical waveform by the maximum value to determine the normalized optical waveform. Further, the one or more processors 222 may determine a period associated with the normalized optical waveform and may process, based on the period associated with the normalized optical waveform, the normalized optical waveform to determine an equivalent pulse width associated with the normalized optical waveform (e.g., a pulse width that is equivalent to a pulse width of a square waveform with the same average optical power).

For example, the one or more processors 222 may process the normalized optical waveform according to the following formula to determine the equivalent pulse width: $w=\int_0^T p_n(t)dt$, where T is the period associated with the normalized optical waveform, $p_n(t)$ is the normalized optical waveform, and w is the equivalent pulse width. Accordingly, the one or more processors 222 may determine, based on the equivalent pulse width, the period associated with the normalized optical waveform, and the average optical power, the peak optical power associated with the optical output pulse of the optical device 106. For example, the one or more processors 222 may determine the peak optical power according to the following formula:

$$P_{peak} = \frac{P_{avg}}{w/T},$$

where T is the period associated with the normalized optical waveform, w is the equivalent pulse width, $P_{avg}$ is the average optical power, and $P_{peak}$ is the peak optical power.

As another example, to determine the peak current associated with the flow of the current pulse (e.g., that has a non-square current waveform) through the optical device 106, the one or more processors 222 may process (e.g., parse) the test information to identify an average current associated with a flow of the charge current through the one or more resistors 114 of the electrical driver circuit 104 (e.g., which matches an average current associated with a flow of the current pulse through the optical device 106, as described above). Further, the one or more processors 222 may identify the optical waveform (e.g., that has a non-square waveform) associated with the optical output pulse of the optical device 106 and may process the optical waveform to determine the normalized optical waveform (e.g., that is approximately equivalent to a normalized current waveform of the current pulse), as described above. The one or more processors 222 may determine the period associated with the normalized optical waveform and may process, based on the period of the normalized optical waveform, the normalized optical waveform to determine the equivalent pulse width associated with the normalized optical waveform (e.g., that is approximately equivalent to a pulse width of the normalized current waveform), as described above. Accordingly, the one or more processors 222 may determine, based on the equivalent pulse width associated with the normalized optical waveform, the period associated with the normalized optical waveform, and the average current of the charge current, the peak current associated with the flow of the current pulse through the optical device 106. For example, the one or more processors 222 may determine the peak current according to the following formula:

$$I_{peak} = \frac{I_{avg}}{w/T},$$

where T is the period associated with the normalized optical waveform, w is the equivalent pulse width associated with the normalized optical waveform, $I_{avg}$ is the average current of the charge current, and $I_{peak}$ is the peak current associated with the flow of the current pulse through the optical device 106.

In an additional example, to determine the peak voltage associated with the flow of the current pulse (e.g., that has a non-square current waveform) through the optical device 106, the one or more processors 222 may process (e.g., parse) the test information to identify a voltage waveform between the anode and the cathode of the optical device 106 associated with the flow of the current pulse through the optical device 106. The one or more processors may process (e.g., using one or more digital signal processing (DSP) techniques), the voltage waveform to remove noise and/or artifacts (e.g., that are associated with parasitic capacitance of the electrical driver circuit 104) from the voltage waveform. Accordingly, the one or more processors 222 may process the voltage waveform to determine an average voltage associated with the flow of the current pulse through the optical device 106. The average voltage from parasitic inductance is $$V_L = \frac{1}{T}\int_0^T L\frac{dI(t)}{dt} dt = 0$$

for periodic pulses, therefore averaging the voltage waveform further removes noise and/or artifacts (e.g., that are associated with parasitic inductance of the electrical driver circuit 104). Further, the one or more processors 222 may identify the optical waveform (e.g., that has a non-square waveform) associated with the optical output pulse of the optical device 106 and may process the optical waveform to determine the normalized optical waveform (e.g., that is approximately the same as a normalized voltage waveform with noise and/or artifacts removed of the current pulse), as described above. The one or more processors 222 may determine the period associated with the normalized optical waveform and may process, based on the period of the normalized optical waveform, the normalized optical waveform to determine the equivalent pulse width associated with the normalized optical waveform (e.g., that is approximately the same as an equivalent pulse width of the normalized voltage waveform), as described above. Accordingly, the one or more processors 222 may determine, based on the equivalent pulse width associated with the normalized optical waveform, the period associated with the normalized optical waveform, and the average voltage of the current pulse, the peak voltage associated with the flow of the current pulse through the optical device 106. For example, the one or more processors 222 may determine the peak voltage according to the following formula:

$$V_{peak} = \frac{V_{avg}}{w/T},$$

where T is the period associated with the normalized optical waveform, w is the equivalent pulse width associated with the normalized optical waveform, $V_{avg}$ is the average voltage of the current pulse, and $V_{peak}$ is the peak voltage associated with the flow of the current pulse through the optical device 106.

In this way, because the normalized optical waveform of the optical output pulse is approximately the same as the normalized current waveform of the current pulse and the average current associated with the charge current matches the average current of the discharge current pulse, the one or more processors 222 may determine the peak current of the current pulse based on the normalized optical waveform and the average current associated with the charge current. Further, because the normalized optical waveform of the optical output pulse is approximately the same as the normalized voltage waveform of the current pulse, the one or more processors 222 may determine the peak voltage of the current pulse based on the normalized optical waveform.

As indicated above, FIG. 2 is provided as an example. Other examples may differ from what is described with regard to FIG. 2.

FIG. 3 is a diagram of an example optical device testing system 300 described herein. As shown in FIG. 3, the optical device testing system 300 may include a rack 302, and one or more motherboards 304. The optical device testing system 300 may include the DC power supply 120, the driver voltage source 122, the pulse generator 124, and/or the ground 206. A motherboard 304, of the one or more motherboards 304, may include a set of card edge connectors 202. Each card edge connector 202 may be configured to physically hold and/or to electrically connect to a PCB 102 (e.g., in a similar manner as that described above in relation to FIG. 2). For example, the card edge connector 202 may include a recess to hold the PCB 102 and may include one or more traces that connect to one or more traces 108 of the PCB 102 (e.g., when the PCB 102 is inserted in the recess of the card edge connector 202). In some implementations, the optical device testing system 300 may be configured to perform reliability stress testing of each optical device 106 associated with the PCBs 102 that are held by each of the sets of card edge connectors 202 that are associated with the one or more motherboards 304.

In some implementations, a motherboard 304, of the one or more motherboards 304, may be physically connected and electrically connected to a set of card edge connectors 202 that are associated with the motherboard 304. In some implementations, the motherboard 304 may be connected to the DC power supply 120, the driver voltage source 122, the pulse generator 124, and/or the ground 206 (e.g., that are configured in a similar manner as that described above in relation to FIG. 2). For example, the DC power supply 120 may be electrically connected to a card edge connector 202, of the set of card edge connectors 202, to provide power to an electrical driver circuit 104 of a PCB 102 held by the card edge connector 202 (e.g., in a similar manner as that described above in relation to FIG. 2). As another example, the driver voltage source 122 may provide a charge current to one or more capacitors 116 of the electrical driver circuit 104, and/or the pulse generator 124 may provide a trigger signal to a switch 110 of the electrical driver circuit 104 (e.g., in a similar manner as that described above in relation to FIG. 2). Accordingly, the motherboard 304 may be configured to cause the one or more capacitors 116 of the electrical driver circuit 104 to discharge a current pulse to the optical device 106 and thereby cause the optical device 106 to emit an optical output pulse.

In some implementations, the motherboard 304 may be configured to provide at least one clock/trigger signal to the switch 110 of the electrical driver circuit 104 to cause the one or more capacitors 116 of the electrical driver circuit to discharge the current pulse to the optical device 106 and cause the optical device 106 to emit the optical output pulse. In some implementations, the motherboard 304 may split the at least one clock/trigger signal via clock signal buffers to control multiple PCBs 102 associated with the set of card edge connectors 202 that are associated with the motherboard 304. In this way, the motherboard 304 may cause the optical devices 106 of PCBs 102 held by the set of card edge connectors 202 to operate at the same time for reliability stress testing of multiple optical devices 106.

In some implementations, the optical device testing system 300 may include an environmental chamber (not shown in FIG. 3) that is configured to hold the rack 302, the one or more motherboards 304, and the respective sets of card edge connectors 202 that hold PCBs 102 within an internal portion of the environmental chamber. The optical device testing system may include one or more handles 306 that facilitate placement of the rack 302 within the internal portion of the environmental chamber (e.g., the one or more handles 306 allow the rack 302 to be lifted and placed in the internal portion of the environmental chamber). In some implementations, environmental chamber may be configured to cause a temperature of the internal portion of the environmental chamber to be greater than or equal to −40 degrees Celsius and less than or equal to 125 degrees Celsius and a relative humidity to be up to 95% (e.g., less than or equal to 95%, as required by a high temperature operating life (HTOL) test, a low temperature operating life (LTOL) test, a power temperature cycling (PTC) test, a wet high temperature operating life (WHTOL) test, and/or a dew test). In this way, environmental chamber may cause the optical devices 106 of PCBs 102 held by the sets of card edge connectors 202 associated with the one or more motherboards 304 to be subject to an environmental stress test.

As indicated above, FIG. 3 is provided as an example. Other examples may differ from what is described with regard to FIG. 3.

Figure 4:
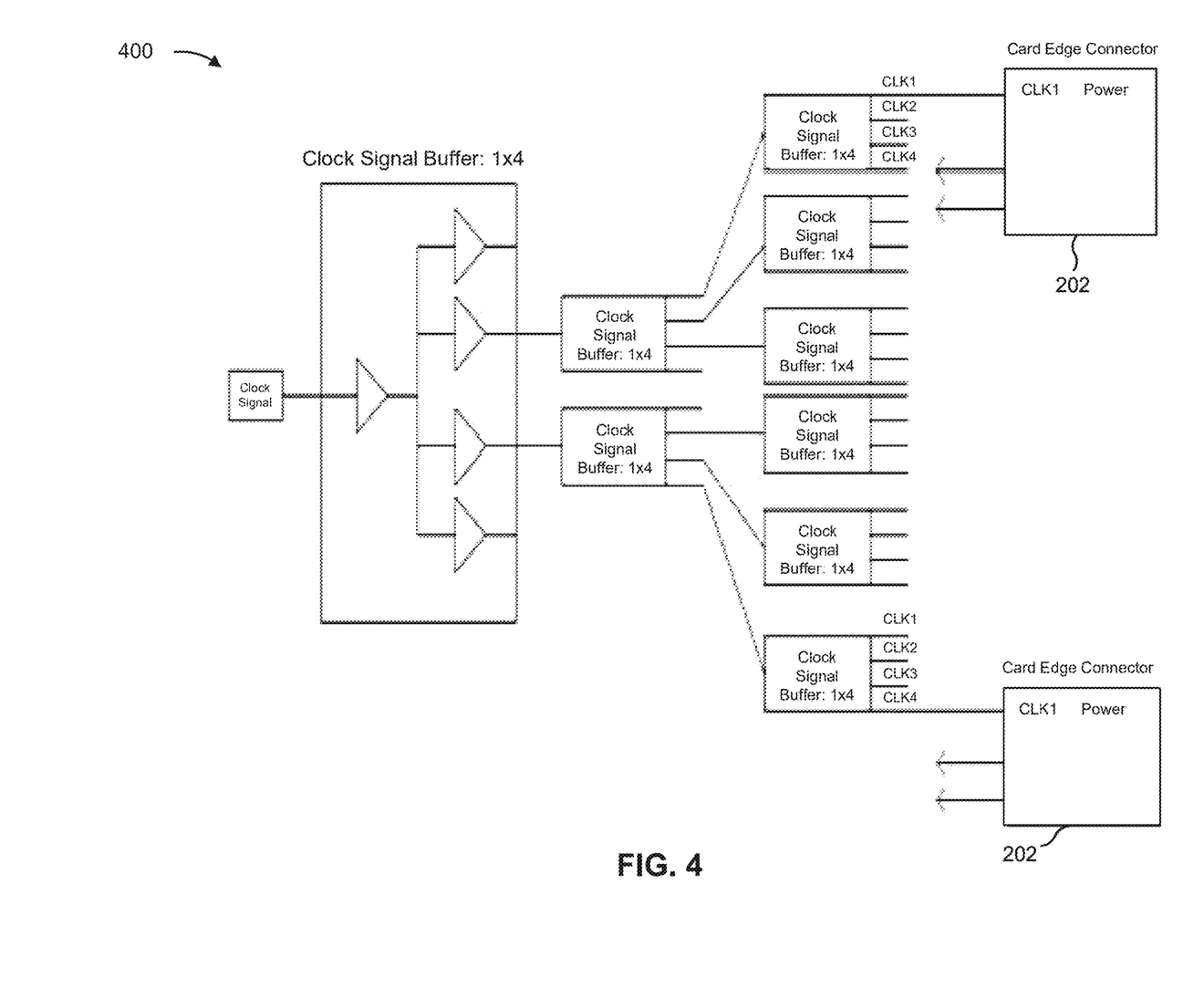
FIG. 4 is a diagram of an example clock signal described herein.

FIG. 4 is a diagram of an example clock signal 400 described herein. As described above, a motherboard 304 may be configured to provide at least one clock/trigger signal. In some implementations, the motherboard 304 may split a control signal to provide the clock/trigger signal to a set of PCBs 102 via card edge connectors 202 associated with the motherboard 304. For example, as shown in FIG. 4, the motherboard 304 may include a structure (e.g., a tree structure) of clock signal buffers to split a clock/trigger signal into multiple portions (e.g., four portions per clock signal buffer). In this way, the same clock/trigger signal may be provided to a plurality of PCBs 102 via card edge connectors 202 of the set of card edge connectors 202.

As indicated above, FIG. 4 is provided as an example. Other examples may differ from what is described with regard to FIG. 4.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A characterization circuit for an optical device, comprising:
   the optical device;
   a switch;
   a switch driver;
   one or more resistors; and
   one or more capacitors, wherein:
      the switch driver is configured to receive, via a first card edge connector trace, a trigger pulse from an external pulse generator and to provide the trigger pulse to the switch,
         wherein a pulse width of the trigger pulse is greater than or equal to a first threshold;
      the switch is configured to receive the trigger pulse from the external pulse generator and to be in an on state when receiving the trigger pulse;
      the switch is configured to be in an off state when not receiving the trigger pulse;
      the one or more capacitors are configured to, when the switch is in the off state, receive, via a second card edge connector trace, a charge current from an external driver voltage source via the one or more resistors,
         wherein a rise time of the charge current is greater than a second threshold;
      the one or more capacitors are configured to, when the switch is in the on state, discharge a current pulse to the optical device,
         wherein a pulse width of the current pulse is less than a third threshold,
         wherein an average current associated with a flow of the charge current through the one or more resistors from the external driver voltage source to the one or more capacitors matches an average current associated with the flow of the current pulse through the optical device; and the optical device is configured to receive the current pulse from the one or more capacitors and to emit, based on a flow of the current pulse through the optical device, an optical output pulse.

2. The characterization circuit of claim 1, wherein:
the first threshold is 10 nanoseconds;
the second threshold is 50 nanoseconds; and
the third threshold is 10 nanoseconds.

3. The characterization circuit of claim 1, wherein the optical device is a vertical cavity surface emitting laser (VCSEL) array having a series resistance.

4. The characterization circuit of claim 1, wherein a series resistance of the optical device, a parasitic inductance of the characterization circuit, and the one or more capacitors form a resistor-inductor-capacitor (RLC) resonance circuit.

5. The characterization circuit of claim 1, further comprising an inductor,
wherein a series resistance of the optical device, the inductor, and the one or more capacitors form a resistor-inductor-capacitor (RLC) resonance circuit.

6. The characterization circuit of claim 1, wherein the switch is a field-effect transistor (FET) switch and the switch driver is a FET driver.

7. The characterization circuit of claim 1, wherein a peak current associated with the flow of the current pulse through the optical device is greater than a peak current associated with a flow of the charge current through the one or more resistors from the external driver voltage source to the one or more capacitors.

8. The characterization circuit of claim 1, wherein:
a peak current associated with a flow of the charge current through the one or more resistors from the external driver voltage source to the one or more capacitors is less than 1 amp; and
a peak current associated with the flow of the current pulse through the optical device is greater than or equal to 200 amps.

9. The characterization circuit of claim 1, wherein:
a current waveform associated with the flow of the current pulse through the optical device is a non-square waveform;
a voltage waveform associated with the flow of the current pulse through the optical device is a non-square waveform; and
an optical waveform associated with the optical output pulse is a non-square waveform.

10. The characterization circuit of claim 1, wherein:
a normalized current waveform associated with the flow of the current pulse through the optical device is a non-square waveform;
a normalized voltage waveform associated with the flow of the current pulse through the optical device is a non-square waveform;
a normalized optical waveform associated with the optical output pulse is a non-square waveform; and
the normalized current waveform and the normalized voltage waveform have approximately a same time dependence as the normalized optical waveform.

11. The characterization circuit of claim 1, wherein the characterization circuit is electrically connected to a card edge connector of an optical device testing system via the first card edge connector trace and the second card edge connector trace.

12. An optical device testing system, comprising:
a printed circuit board (PCB) that comprises an electrical driver circuit that includes an optical device;
a card edge connector;
a direct current (DC) power supply;
a driver voltage source;
a pulse generator; and
one or more testing components, wherein:
the card edge connector is electrically connected to the PCB via one or more card edge connector traces of the PCB;
the DC power supply is configured to provide power to the electrical driver circuit of the PCB;
the driver voltage source is configured to provide a charge current to one or more capacitors of the electrical driver circuit;
the pulse generator is configured to provide a trigger pulse to a field-effect transistor (FET) switch of the electrical driver circuit,
wherein a pulse width of the trigger pulse is greater than or equal to 10 nanoseconds,
wherein providing the trigger pulse to the FET switch causes the one or more capacitors of the electrical driver circuit to discharge a current pulse to the optical device, which causes the optical device to emit an optical output pulse, and
wherein a pulse width of the current pulse is less than 10 nanoseconds; and
the optical device testing system is configured to perform characterization testing of the optical device.

13. The optical device testing system of claim 12, wherein the one or more testing components includes at least one of:
an integrating sphere;
a power meter;
a spectrometer;
an oscilloscope;
a near field camera;
a far field camera; or
a multi-meter.

14. The optical device testing system of claim 12, further comprising one or more processors, wherein the one or more processors are configured to:
cause the driver voltage source to provide the charge current to the one or more capacitors of the electrical driver circuit;
cause the pulse generator to provide the trigger pulse to the FET switch of the electrical driver circuit to cause the one or more capacitors of the electrical driver circuit to discharge the current pulse to the optical device and cause the optical device to emit the optical output pulse; and
perform one or more actions, including at least one of:
determine a peak optical power associated with the optical output pulse,
determine a peak current associated with a flow of the current pulse through the optical device,
determine a peak voltage associated with the flow of the current pulse through the optical device,
determine a wavelength spectrum associated with the optical output pulse,
determine a near field pattern associated with the optical output pulse, or
determine far field properties associated with the optical output pulse.

15. The optical device testing system of claim 14, wherein the one or more processors are configured to, when determining the peak optical power associated with the optical output pulse:
identify an average optical power and an optical waveform associated with the optical output pulse of the optical device;

process the optical waveform to determine a normalized optical waveform;
process, based on a period associated with the normalized optical waveform, the normalized optical waveform to determine an equivalent pulse width associated with the normalized optical waveform; and
determine, based on the equivalent pulse width, the period, and the average optical power, the peak optical power associated with the optical output pulse.

16. The optical device testing system of claim 14, wherein the one or more processors are configured to, when determining the peak current associated with the flow of the current pulse through the optical device:
identify an average current associated with a flow of the charge current through one or more resistors of the electrical driver circuit;
identify an optical waveform associated with the optical output pulse of the optical device;
process the optical waveform to determine a normalized optical waveform;
process, based on a period associated with the normalized optical waveform, the normalized optical waveform to determine an equivalent pulse width associated with the normalized optical waveform; and
determine, based on the equivalent pulse width, the period, and the average current, the peak current associated with the flow of the current pulse through the optical device.

17. The optical device testing system of claim 14, wherein the one or more processors are configured to, when determining the peak voltage associated with the flow of the current pulse through the optical device:
identify a voltage waveform associated with the flow of the current pulse through the optical device;
process, using at least one digital signal processing (DSP) technique, the voltage waveform to remove artifacts from the voltage waveform;
determine, based on the processed voltage waveform, an average voltage associated with the flow of the current pulse through the optical device;
identify an optical waveform associated with the optical output pulse of the optical device;
process the optical waveform to determine a normalized optical waveform;
process, based on a period associated with the normalized optical waveform, the normalized optical waveform to determine an equivalent pulse width associated with the normalized optical waveform; and
determine, based on an equivalent pulse width, the period, and the average voltage, the peak voltage associated with the flow of the current pulse through the optical device.

18. An optical device testing system, comprising:
an optical pulse generator that comprises an electrical driver circuit that includes an optical device;
a direct current (DC) power supply;
a driver voltage source;
a pulse generator;
a card edge connector;
a motherboard; and
an environmental chamber, wherein:
the card edge connector is electrically connected to the optical pulse generator via one or more card edge connector traces of the optical pulse generator,
the card edge connector is electrically connected to the motherboard,
the DC power supply is electrically connected to the motherboard and is configured to provide power to the electrical driver circuit of the optical pulse generator via the motherboard, the card edge connector, and a first card edge connector trace of the one or more card edge connector traces,
the driver voltage source is electrically connected to the motherboard and is configured to provide a charge current to one or more capacitors of the electrical driver circuit via the motherboard, the card edge connector, and a second card edge connector trace of the one or more card edge connector traces,
wherein a rise time of the charge current is greater than 50 nanoseconds,
the pulse generator is electrically connected to the motherboard and is configured to provide a trigger pulse to a switch of the electrical driver circuit via the motherboard, the card edge connector, and a third card edge connector trace of the one or more card edge connector traces,
wherein a pulse width of the trigger pulse is greater than or equal to 10 nanoseconds,
wherein providing the trigger pulse to the switch causes the one or more capacitors of the electrical driver circuit to discharge a current pulse to the optical device, which causes the optical device to emit an optical output pulse, and
wherein a pulse width of the current pulse is less than 10 nanoseconds,
the environmental chamber is configured to hold the motherboard, the card edge connector, and the optical pulse generator with the optical device within an internal portion of the environmental chamber, and
the optical device testing system is configured to perform reliability stress testing of the optical device.

19. The optical device testing system of claim 18, wherein the motherboard is configured to split and provide a clock/trigger signal to the optical pulse generator and one or more other optical pulse generators connected to the motherboard via clock signal buffers to cause the optical device and respective optical devices of the one or more other optical pulse generators to operate at the same time for reliability stress testing.

20. The optical device testing system of claim 18, wherein the environmental chamber is configured to at least one of:
cause a temperature of the internal portion of the environmental chamber to be greater than or equal to −40 degrees Celsius and/or less than or equal to 125 degrees Celsius; or
cause a relative humidity level of the internal portion of the environmental chamber to be less than or equal to 95%.

* * * * *